United States Patent
Taguchi

(10) Patent No.: US 7,262,993 B2
(45) Date of Patent: Aug. 28, 2007

(54) NONVOLATILE SEMICONDUCTOR MEMORY DEVICE

(75) Inventor: Kazuo Taguchi, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/388,056

(22) Filed: Mar. 23, 2006

(65) Prior Publication Data

US 2006/0221668 A1    Oct. 5, 2006

(30) Foreign Application Priority Data

Mar. 29, 2005    (JP) .............................. 2005-095559

(51) Int. Cl.
   *G11C 16/04*    (2006.01)
(52) U.S. Cl. .............................. 365/185.08; 365/185.1; 257/315; 257/316
(58) Field of Classification Search ............ 365/185.08
   See application file for complete search history.

(56) References Cited

U.S. PATENT DOCUMENTS

| | | | | |
|---|---|---|---|---|
| 5,712,817 A | * | 1/1998 | Suh ........................ | 365/185.08 |
| 5,717,237 A | * | 2/1998 | Chi .............................. | 257/315 |
| 5,719,427 A | * | 2/1998 | Tong et al. .................. | 257/355 |
| 5,742,542 A | * | 4/1998 | Lin et al. ................ | 365/185.08 |
| 5,892,709 A | * | 4/1999 | Parris et al. ........... | 365/185.01 |
| 5,905,675 A | * | 5/1999 | Madurawe et al. .... | 365/185.18 |
| 6,064,595 A | * | 5/2000 | Logie et al. ........... | 365/185.18 |
| 6,100,560 A | * | 8/2000 | Lovett ........................ | 257/315 |
| 6,122,192 A | | 9/2000 | Furuhata et al. | |
| 6,512,700 B1 | * | 1/2003 | McPartland et al. ... | 365/185.28 |
| 6,515,912 B1 | * | 2/2003 | Tao et al. .............. | 365/185.28 |
| 6,731,541 B2 | * | 5/2004 | Kinsey et al. ......... | 365/185.18 |
| 7,099,192 B2 | * | 8/2006 | Wang et al. ............. | 365/185.1 |
| 7,130,213 B1 | * | 10/2006 | Raszka ....................... | 365/149 |

FOREIGN PATENT DOCUMENTS

JP    11-233654    8/1999

* cited by examiner

*Primary Examiner*—Son L. Mai
(74) *Attorney, Agent, or Firm*—Harness, Dickey & Pierce, P.L.C.

(57) ABSTRACT

A nonvolatile semiconductor memory device including: a first capacitor, one end of the first capacitor being connected to a floating node; a detection transistor, a gate electrode of the detection transistor being connected to the floating node; a second capacitor, one end of the second capacitor being connected to the floating node, and the other end of the second capacitor being connected to a drain of the detection transistor; and an auxiliary capacitor, one end of the auxiliary capacitor being connected to the floating node, wherein, at least during write operation, a control gate voltage is supplied to the other end of the first capacitor, a control drain voltage is supplied to the other end of the second capacitor, and a capacitance ratio correction voltage which is higher than a voltage of the floating node is supplied to the other end of the auxiliary capacitor.

15 Claims, 12 Drawing Sheets

NONVOLATILE SEMICONDUCTOR MEMORY DEVICE

Japanese Patent Application No. 2005-95559, filed on Mar. 29, 2005, is hereby incorporated by reference in its entirety.

BACKGROUND OF THE INVENTION

The present invention relates to a nonvolatile semiconductor memory device.

A basic operational principle of a nonvolatile memory is that an electric charge is injected into or discharged from a floating gate, and a logical "1" or a logical "0" is determined by a change in threshold value of a detection transistor or the like (JP-A-11-233654). The write method is divided into a method utilizing a hot carrier and a method utilizing an FN current. However, since either method uses the floating gate, the presence of a parasitic capacitor near the floating gate causes a problem. In many cases, the write characteristics are changed to a large extent due to the presence or absence of a small parasitic capacitor.

For example, when writing data by utilizing the capacitance ratio, a large capacitance ratio is necessary for applying a relatively high voltage to the floating gate. The layout area must be increased in order to increase the capacitance ratio, whereby the parasitic capacitance is increased. It is necessary to further increase the size of the capacitor so that the parasitic capacitor can be ignored. This results in a vicious circle.

Since most of the parasitic capacitors are formed by coupling with a substrate, it is necessary to take the parasitic capacitors into consideration when calculating the capacitance ratio. However, it is difficult to accurately calculate the parasitic capacitors included in a complicated three-dimensional shape. As a result, confirmation by trial manufacture is necessary so that a reduction in development cost is hindered.

SUMMARY

According to one aspect of the invention, there is provided a nonvolatile semiconductor memory device comprising:
a first capacitor, one end of the first capacitor being connected to a floating node;
a detection transistor, a gate electrode of the detection transistor being connected to the floating node;
a second capacitor, one end of the second capacitor being connected to the floating node, and the other end of the second capacitor being connected to a drain of the detection transistor; and
an auxiliary capacitor, one end of the auxiliary capacitor being connected to the floating node,
wherein, at least during write operation, a control gate voltage is supplied to the other end of the first capacitor, a control drain voltage is supplied to the other end of the second capacitor, and a capacitance ratio correction voltage which is higher than a voltage of the floating node is supplied to the other end of the auxiliary capacitor.

DETAILED DESCRIPTION OF THE EMBODIMENT

Figure 1:
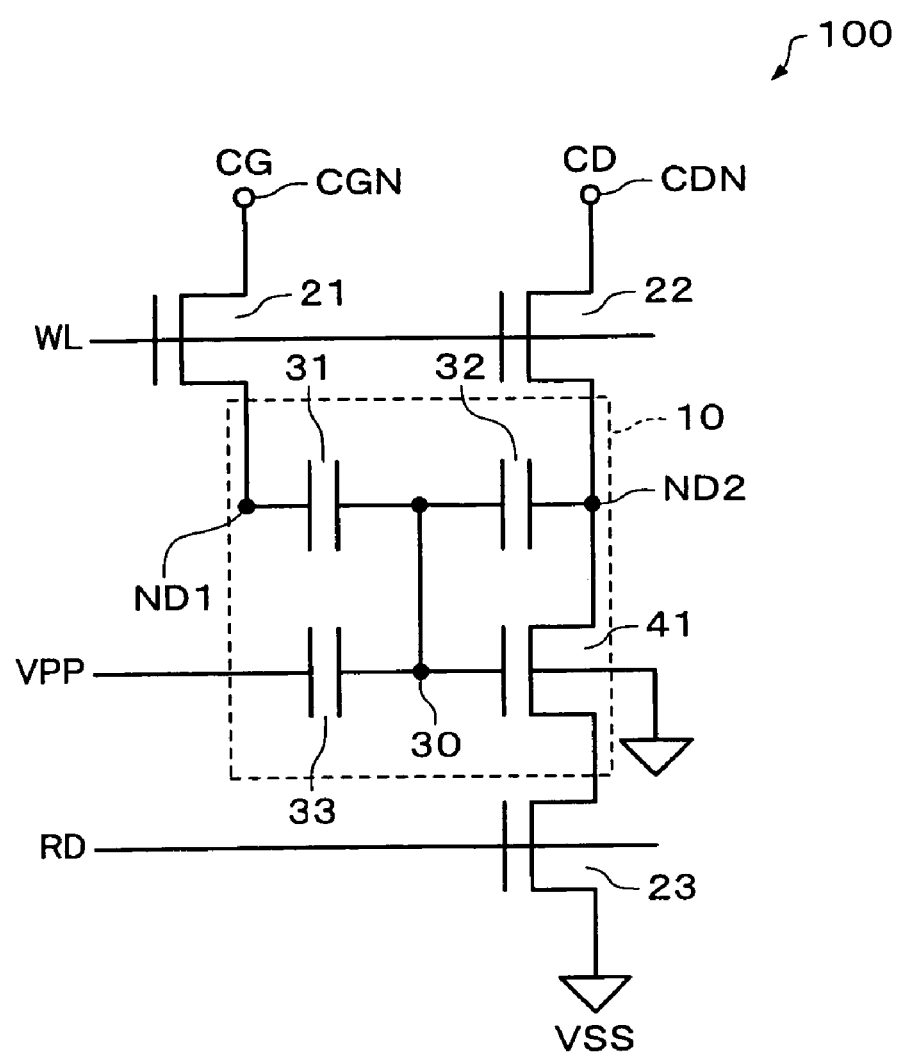
FIG. 1 is a configuration example of a nonvolatile semiconductor memory device according to one embodiment of the invention.

The invention may provide a nonvolatile semiconductor memory device which improves write characteristics and maintains stable write characteristics.

According to one embodiment of the invention, there is provided a nonvolatile semiconductor memory device comprising:
a first capacitor, one end of the first capacitor being connected to a floating node;
a detection transistor, a gate electrode of the detection transistor being connected to the floating node;
a second capacitor, one end of the second capacitor being connected to the floating node, and the other end of the second capacitor being connected to a drain of the detection transistor; and
an auxiliary capacitor, one end of the auxiliary capacitor being connected to the floating node,
wherein, at least during write operation, a control gate voltage is supplied to the other end of the first capacitor, a control drain voltage is supplied to the other end of the second capacitor, and a capacitance ratio correction voltage which is higher than a voltage of the floating node is supplied to the other end of the auxiliary capacitor.

This enables correction of a change in the capacitance ratio of the first capacitor and the second capacitor due to a parasitic capacitor of the floating node. Specifically, a stable write operation can be performed so that deterioration of an oxide film of the second capacitor and a decrease in reliability can be prevented.

In this nonvolatile semiconductor memory device, at least during write operation, the capacitance ratio correction voltage may be set at a voltage equal to or higher than either a voltage supplied to the other end of the first capacitor or a voltage supplied to the other end of the second capacitor, whichever is the higher.

Therefore, when the voltage supplied to the other end of the first capacitor is higher than the voltage supplied to the other end of the second capacitor, the potential of the floating node is based on the capacitance ratio of a composite capacitance of the capacitance of the auxiliary capacitor and the capacitance of the first capacitor and a composite capacitance of the gate capacitance of the detection transistor and the capacitance of the second capacitor. Likewise, when the voltage supplied to the other end of the second capacitor is higher than the voltage supplied to the other end of the first capacitor, the potential of the floating node is based on the capacitance ratio of a composite capacitance of the capacitance of the auxiliary capacitor and the capacitance of the second capacitor and a composite capacitance of the gate capacitance of the detection transistor and the capacitance of the first capacitor. Specifically, the difference in capacitance ratio between the write operation of writing a logical "1" and the write operation of writing a logical "0" can be reduced.

In this nonvolatile semiconductor memory device,
at least during write operation, the capacitance ratio correction voltage may be set at a voltage equal to either the control gate voltage or the control drain voltage, whichever is the higher.

The nonvolatile semiconductor memory device may further comprise a capacitance ratio correction switch which is set to ON state during write operation,
wherein the capacitance ratio correction voltage is supplied to the other end of the auxiliary capacitor through the capacitance ratio correction switch during write operation.

This enables the capacitance ratio correction voltage to be supplied to the other end of the auxiliary capacitor during the write operation.

In this nonvolatile semiconductor memory device,
the capacitance ratio correction switch may be formed of a first transistor;
a drain of the first transistor may be connected to the other end of the auxiliary capacitor, and the capacitance ratio correction voltage may be supplied to a source of the first transistor; and
a voltage which sets the first transistor to ON state may be supplied to a gate electrode of the first transistor during write operation.

In this nonvolatile semiconductor memory device,
a capacitance of the auxiliary capacitor may be set to be equal to a gate capacitance of the detection transistor.

This reduces the difference in capacitance ratio between the write operation of writing a logical "1" and the write operation of writing a logical "0". Specifically, the difference between the voltage applied to the second capacitor during the write operation of writing a logical "1" and the voltage applied to the second capacitor during the write operation of writing a logical "0" can be reduced.

In this nonvolatile semiconductor memory device,
the other end of the auxiliary capacitor may be set to a floating state during read operation.

This eliminates the effects of the auxiliary capacitor during the read operation.

In this nonvolatile semiconductor memory device,
the other end of the auxiliary capacitor may be set to a ground level voltage during read operation.

This eliminates the effects of the auxiliary capacitor during the read operation.

The nonvolatile semiconductor memory device may further comprise a grounding switch which is set to OFF state during write operation and is set to ON state during read operation,
wherein a ground level voltage is supplied to the other end of the auxiliary capacitor through the grounding switch during read operation.

This enables the other end of the auxiliary capacitor to be set at a ground level during the read operation.

The nonvolatile semiconductor memory device may further comprise a second transistor which is set to OFF state during write operation and is set to ON state during read operation,
wherein, during write operation, a write enable signal set to active is supplied to the gate electrode of the first transistor so that the first transistor is set to ON state, a signal obtained by inverting the write enable signal set to active is supplied to a gate electrode of the second transistor so that the second transistor is set to OFF state, and the capacitance ratio correction voltage is supplied to the other end of the auxiliary capacitor through the first transistor which has been set to ON state; and
wherein, during read operation, the write enable signal set to inactive is supplied to the gate electrode of the first transistor so that the first transistor is set to OFF state, a signal obtained by inverting the write enable signal set to inactive is supplied to the gate electrode of the second transistor so that the second transistor is set to ON state, and a ground level voltage is supplied to the other end of the auxiliary capacitor through the second transistor which has been set to ON state.

This enables the other end of the auxiliary capacitor to be set at different potentials during the read operation and the write operation. Specifically, the other end of the auxiliary capacitor can be set at a ground level during the read operation, and the capacitance ratio correction voltage can be supplied to the other end of the auxiliary capacitor during the write operation.

The nonvolatile semiconductor memory device may further comprise:
a first select transistor provided between a supply node of the control gate voltage and the other end of the first capacitor; and
a second select transistor provided between a supply node of the control drain voltage and the other end of the second capacitor,
wherein, during write operation, a select voltage is supplied to gate electrodes of the first and second select transistors so that the first and second select transistors are set to ON state, the control gate voltage is supplied to the other end of the first capacitor through the first select transistor which has been set to ON state, and the control drain voltage is supplied to the other end of the second capacitor through the second select transistor which has been set to ON state.

This allows the control gate voltage to be supplied to the other end of the first capacitor and the control drain voltage to be supplied to the other end of the second capacitor.

In this nonvolatile semiconductor memory device,
the auxiliary capacitor may be formed in a region over a first capacitor formation region in which the first capacitor is formed.

This enables the auxiliary capacitor to be formed without unnecessarily increasing the layout area of the nonvolatile semiconductor memory device.

In this nonvolatile semiconductor memory device,
a second capacitor formation region in which the second capacitor is formed may be formed on a first direction side of the first capacitor formation region; and
an area of the second capacitor formation region may be smaller than an area of the first capacitor formation region.

Therefore, since the formation region of the first capacitor is formed to have a large area so that the capacitance of the first capacitor is larger than the capacitance of the second capacitor, the capacitance of the auxiliary capacitor can be increased.

In this nonvolatile semiconductor memory device,
when a direction perpendicular to the first direction is a second direction, a detection transistor gate electrode formation region in which the gate electrode of the detection transistor is formed may be formed on the first direction side of the first capacitor formation region and on the second direction side of the second capacitor formation region.

This reduces the layout area of the nonvolatile semiconductor memory device.

In this nonvolatile semiconductor memory device,
a first select transistor gate electrode formation region in which a gate electrode of a first select transistor is formed may be formed on a side of the first capacitor formation region in a direction opposite to the second direction; and
a second select transistor gate electrode formation region in which a gate electrode of a second select transistor is formed may be formed on a side of the second capacitor formation region in a direction opposite to the second direction and on the first direction side of the first select transistor gate electrode formation region.

These embodiments of the invention will be described in detail below, with reference to the drawings. Note that the embodiments described below do not in any way limit the scope of the invention laid out in the claims herein. In addition, not all of the elements of the embodiments described below should be taken as essential requirements of the invention. In the drawings, components denoted by the same reference numbers have the same meanings.

1. Nonvolatile Semiconductor Memory Device

A configuration example of an electrically erasable programmable read-only memory (EEPROM) 100 is given below as an example of a nonvolatile semiconductor memory device.

FIG. 1 is a circuit diagram showing a part of the EEPROM 100 (nonvolatile semiconductor memory device in a broad sense) according to one embodiment of the invention. The EEPROM 100 includes a select transistor 21 (first select transistor in a broad sense), a select transistor 22 (second select transistor in a broad sense), a cell 10, and a read transistor 23. The cell 10 includes first and second capacitors 31 and 32, a floating node 30, an auxiliary capacitor 33, and a detection transistor 41. The EEPROM 100 may include a plurality of cells 10, for example. The cell 10 may store one-bit data, for example. A node CGN is a supply node to which a control gate voltage CG is supplied, and a node CDN is a supply node to which a control drain voltage CD is supplied.

In one embodiment of the invention, an operation of injecting or discharging an electric charge into or from the floating node 30 is defined as a write operation. In the write operation, an operation of injecting an electric charge into the floating node 30 is defined as a write operation of a logical "1", and an operation of discharging an electric charge from the floating node 30 is defined as a write operation of a logical "0", for example.

The select transistors 21 and 22 are formed by N-type transistors, for example. The gates of the select transistors 21 and 22 are connected with a wordline WL. One end of the select transistor 21 is connected with the first capacitor 31 of the cell 10. The control gate voltage CG is supplied to the other end of the select transistor 21. One end of the select transistor 22 is connected with the second capacitor 32 and the drain of the detection transistor 41 of the cell 10. The control drain voltage CD is supplied to the other end of the select transistor 22.

For example, when a select voltage for selecting the cell 10 is supplied to the wordline WL, the select transistors 21 and 22 are turned ON. This allows the control gate voltage CG and the control drain voltage CD to be supplied to the cell 10. In this configuration example, data can be written in bit units.

One end of the first capacitor 31 of the cell 10 is connected with one end of the select transistor 21, and the other end of the first capacitor 31 is connected with the floating node 30. One end of the second capacitor 32 is connected with the floating node 30, and the other end of the second capacitor 32 is connected with one end of the select transistor 22.

One end of the auxiliary capacitor 33 of the cell 10 is connected with the floating node 30, and a capacitance ratio correction voltage VPP is supplied to the other end of the auxiliary capacitor 33 at least during the write operation. For example, the capacitance ratio correction voltage VPP is set at either the control gate voltage CG or the control drain voltage CD, whichever is the higher. For example, when the control gate voltage CG is set at 10 V and the control drain voltage CD is set at 0 V during the write operation, the capacitance ratio correction voltage VPP is set at 10 V. When the control gate voltage CG is set at 0 V and the control drain voltage CD is set at 10 V during the write operation, the capacitance ratio correction voltage VPP is also set at 10 V.

Note that the capacitance ratio correction voltage VPP is not limited to the above-mentioned voltage. The capacitance ratio correction voltage VPP may be set at a voltage higher than the voltage of the floating node 30 during the write operation, for example. The capacitance ratio correction voltage VPP may be set at a voltage equal to or higher than the voltage of a node ND1 or ND2 during the write operation.

The gate electrode of the detection transistor 41 is connected with the floating node 30, and the drain of the detection transistor 41 is connected with one end of the select transistor 22. The source of the detection transistor 41 is connected with the drain of the read transistor 23, and a ground level voltage VSS is supplied to the source of the read transistor 23, for example.

In the EEPROM 100, the capacitance ratio is determined by the capacitances of the first and second capacitors 31 and 32. The potential of the floating node 30 during the write operation is approximately set at a potential based on the capacitance ratio, the control gate voltage CG, and the control drain voltage CD. A logical "1" or a logical "0" can be written into the cell 10 by controlling the control gate voltage CG and the control drain voltage CD, for example.

The capacitance of the second capacitor 32 is set to be smaller than the capacitance of the first capacitor 31, for example. An oxide film forming the second capacitor 32 is formed by a thin oxide film (tunnel film) for injecting or discharging an electric charge.

The above-mentioned capacitance ratio is designed so that an electric field applied to the tunnel film is 10 MV/cm or more, for example. The capacitance ratio is not limited thereto when the write time can be set in a certain range. Since the thin tunnel film has a low breakdown voltage, the tunnel film easily breaks when the electric field applied to the tunnel film is increased to a large extent. Even if the tunnel film does not break, damage due to application of the high electrical field is accumulated, whereby the endurance is rapidly decreased. Therefore, the capacitance ratio is preferably set so that the upper limit is not exceeded.

The read transistor 23 is turned ON during a data read operation, for example. The read transistor 23 may be included in the cell 10, or may be provided outside the cell 10 and used by two or more cells 10.

Since the gate electrode of the detection transistor 41 is connected with the floating node 30, data stored in the cell 10 can be read by detecting the ON/OFF state of the detection transistor 41 using a sense amplifier or the like.

In one embodiment of the invention, the operation of injecting or discharging an electric charge into or from the floating node 30 is defined as the write operation. However, the invention is not limited thereto. For example, the operation of injecting an electric charge into the floating node 30 may be defined as the write operation, and the operation of discharging an electric charge from the floating node 30 may be defined as an erase operation. In one embodiment of the invention, writing of a logical "1" or a logical "0" is described as the write operation for convenience. However, the invention is not limited thereto. For example, writing of a logical "1" may be defined as the writing operation and writing of a logical "0" may be defined as the erase operation, and vice versa.

2. Operation

Figure 2:
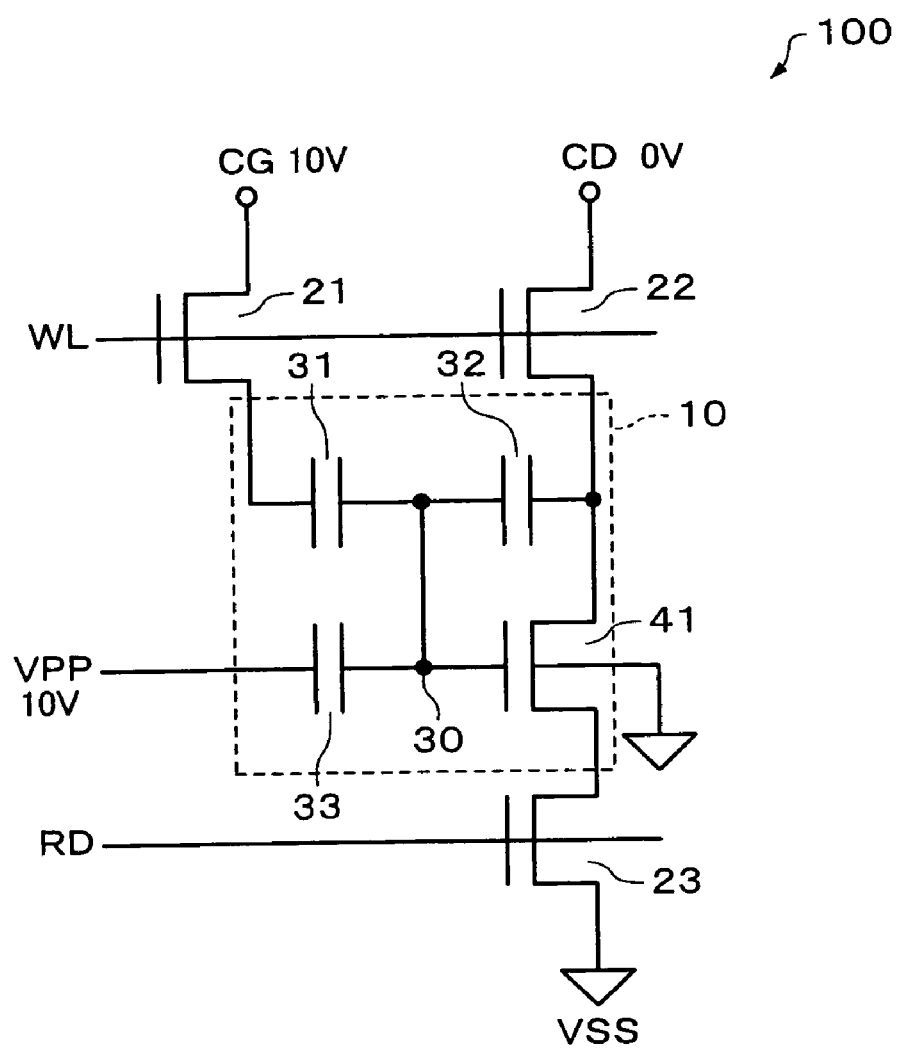
FIG. 2 is illustrative of a write HIGH operation according to one embodiment of the invention.

FIG. 2 shows the operation of writing a logical "1" (hereinafter also called "write HIGH operation"), for example.

In the write HIGH operation, the control gate voltage CG is set at a high voltage (e.g. 10 V), and the control drain voltage CD is set at a low voltage (e.g. 0 V). Since the select voltage is supplied to the wordline WL, 10 V is supplied to one end of the first capacitor 31, and 0 V is supplied to the other end of the second capacitor 32, for example.

The capacitance ratio correction voltage VPP (e.g. 10 V) is supplied to the other end of the auxiliary capacitor 33. In the write operation, a signal set to inactive is supplied to a read signal line RD so that the read transistor 23 is turned OFF.

The potential of the floating node 30 is set at a potential based on the capacitance ratio, the control gate voltage CG, and the control drain voltage CD. In this case, the capacitance ratio is determined by the capacitances of the first and second capacitors 31 and 32, the gate capacitance of the detection transistor 41 with respect to the substrate potential, and the capacitance of the auxiliary capacitor 33.

Figure 3:
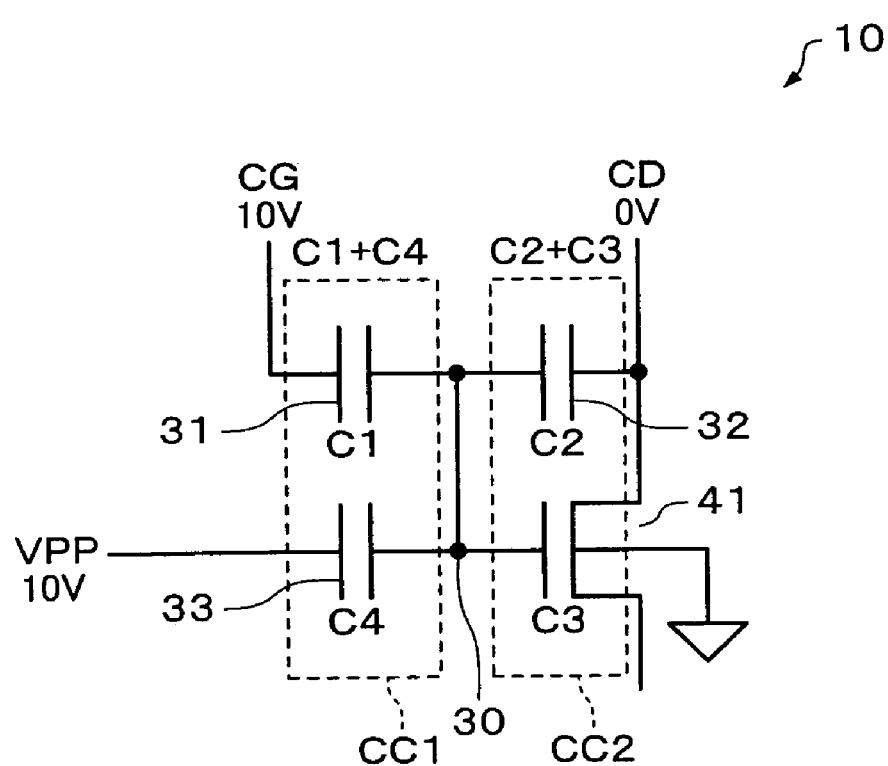
FIG. 3 is a diagram illustrative of the write HIGH operation according to one embodiment of the invention.

FIG. 3 is a diagram showing the capacitance ratio of the cell 10 during the write HIGH operation.

The capacitance of the first capacitor 31 is indicated by C1, the capacitance of the second capacitor 32 is indicated by C2, the gate capacitance of the detection transistor 41 with respect to the substrate potential is indicated by C3, and the capacitance of the auxiliary capacitor 33 is indicated by C4. In one embodiment of the invention, the capacitance C4 of the auxiliary capacitor 33 is set at the same value as the gate capacitance C3 of the detection transistor 41, for example. However, the invention is not limited thereto.

As shown in FIG. 3, 10 V is supplied to one end of the capacitor 31, and 10 V is supplied to the other end of the auxiliary capacitor 33 as the capacitance ratio correction voltage. Specifically, the capacitor 31 and the auxiliary capacitor 33 are connected in parallel.

The other end of the capacitor 32 is set at 0 V. The gate capacitance C3 of the detection transistor 41 is the capacitance with respect to the substrate potential. Specifically, the capacitor 32 and the gate capacitor of the detection transistor 41 are connected in parallel.

Therefore, a composite capacitor CC1 having a capacitance of "C1+C4" and a composite capacitor CC2 having a capacitance of "C2+C3" are connected in series through the floating node 30. The control gate voltage CG (e.g. 10 V) and the control drain voltage CD (e.g. 0 V) are supplied to opposite ends of the composite capacitors CC1 and CC2 connected in series.

Suppose that the capacitance ratio is "C1:C2:C3:C4=8:2:1:1", for example. Therefore, the capacitance ratio of the composite capacitor CC1 to the composite capacitor CC2 is "(8+1):(2+1)=9:3". In this case, 7.5 V, which is obtained by capacitively dividing 10 V at a ratio of "3:9", should be applied to the tunnel film of the capacitor 32.

On the other hand, when a voltage is applied to a thin oxide film (tunnel film), a tunnel current approximately proportional to the logarithm of the applied voltage flows. The current value depends on the thickness of the oxide film, for example.

Consider the case where the tunnel film of the capacitor 32 is formed to have such a thickness that a sufficient tunnel current flows at an applied voltage of 7.5 V. In this case, 7.5 V should be applied to the tunnel film of the capacitor 32. However, since a tunnel current flows, the voltage across the capacitor 32 is reduced to about 6 V after a short time, for example.

Specifically, a negative electric charge is injected into the floating node 30.

The write HIGH operation is performed in this manner. It suffices that the capacitance ratio correction voltage VPP be set at a potential higher than the potential of the floating node 30. As described above, the potential of the floating node 30 is determined by the capacitance ratio of the composite capacitors CC1 and CC2 determined from the capacitances C1 to C4, the control gate voltage CG, and the control drain voltage CD. The upper limit of the capacitance ratio of the composite capacitors CC1 and CC2 is determined based on the thickness of the tunnel film of the capacitor 32. The thickness of the tunnel film of the capacitor 32 and the capacitance ratio of the composite capacitors CC1 and CC2 may be determined based on the application of the EEPROM 100.

For example, when the write operation speed is a first priority, the thickness of the capacitor 32 may be reduced, or the capacitance ratio of the composite capacitors CC1 and CC2 may be increased. Since the voltage applied to the tunnel film of the capacitor 32 increases as the capacitance ratio becomes higher, the write speed correspondingly increases.

The capacitance ratio correction voltage VPP may be set at a voltage equal to or higher than the high voltage (e.g. 10 V) supplied as the control gate voltage CG at least during the write HIGH operation, for example.

Figure 4:
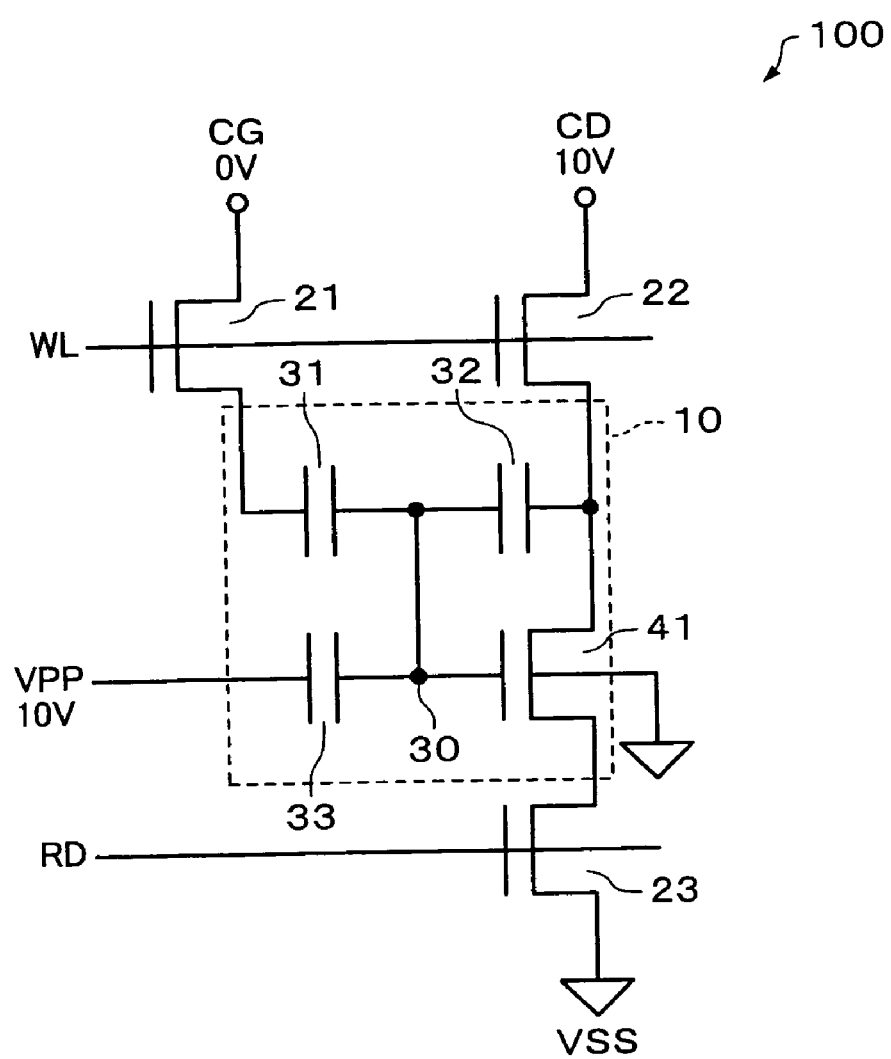
FIG. 4 is illustrative of a write LOW operation according to one embodiment of the invention.

FIG. 4 shows the operation of writing a logical "0" (hereinafter also called "write LOW operation"), for example.

In the write LOW operation, the control gate voltage CG is set at a low voltage (e.g. 0 V), and the control drain voltage CD is set at a high voltage (e.g. 10 V). Since the select voltage is supplied to the wordline WL, 0 V is supplied to one end of the first capacitor 31, and 10 V is supplied to the other end of the second capacitor 32, for example.

The capacitance ratio correction voltage VPP (e.g. 10 V) is supplied to the other end of the auxiliary capacitor 33. In the write operation, a signal set to inactive is supplied to the read signal line RD so that the read transistor 23 is turned OFF.

In this case, the potential of the floating node 30 is set at a potential based on the capacitance ratio, the control gate voltage CG, and the control drain voltage CD in the same manner as in the write HIGH operation.

Figure 5A:
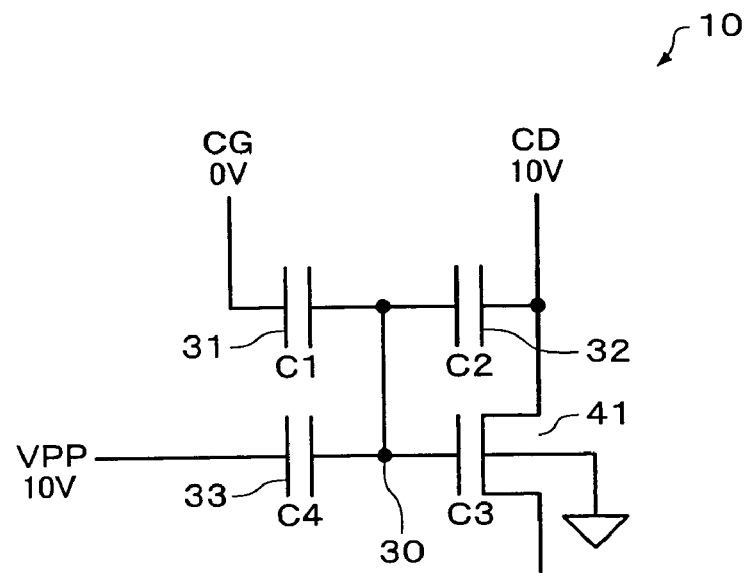
FIGS. 5A and 5B are diagrams illustrative of the write LOW operation according to one embodiment of the invention.
Figure 5B:
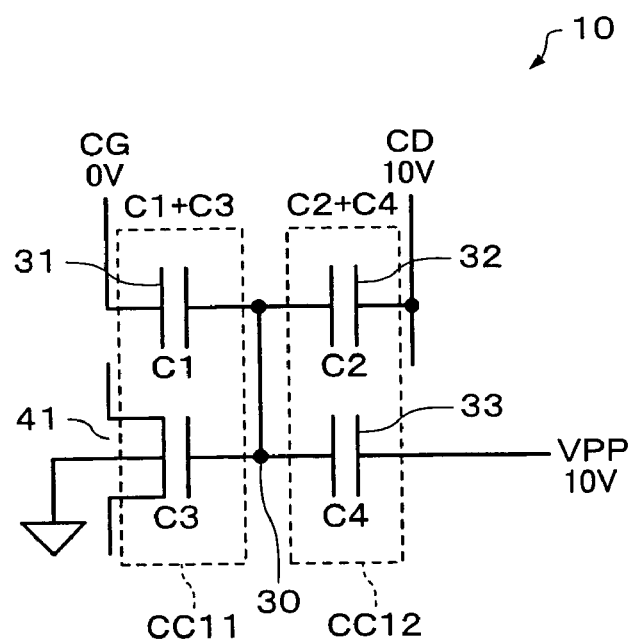

FIGS. 5A and 5B are diagrams showing the capacitance ratio of the cell 10 during the write LOW operation. FIGS. 5A and 5B illustrate the case where the capacitances C1 to C4 are set at a capacitance ratio similar to that of FIG. 3.

As shown in FIG. 5A, 0 V is supplied to one end of the capacitor 31, and 10 V is supplied to the other end of the auxiliary capacitor 33 as the capacitance ratio correction voltage. 10 V is supplied to the other end of the capacitor 32. Specifically, the capacitor 32 and the auxiliary capacitor 33 are connected in parallel, and the capacitor 31 and the gate capacitor of the detection transistor 41 are connected in parallel, as shown in FIG. 5B.

Therefore, a composite capacitor CC11 having a capacitance of "C1+C3" and a composite capacitor CC12 having a capacitance of "C2+C4" are connected in series through the floating node 30. The control gate voltage CG (e.g. 0 V) and the control drain voltage CD (e.g. 10 V) are supplied to opposite ends of the composite capacitors CC11 and CC12 connected in series.

Therefore, the capacitance ratio of the composite capacitor CC11 to the composite capacitor CC12 is "(8+1):(2+1) =9:3". In this case, 7.5 V, which is obtained by capacitively dividing 10 V at a ratio of "3:9", should be applied to the tunnel film of the capacitor 32. However, since a tunnel current flows through the tunnel film of the capacitor 32 during the write LOW operation in the same manner as in the write HIGH operation, the potential difference is reduced to about 6 V after a short time.

Specifically, a negative electric charge is discharged from the floating node 30.

The write LOW operation is performed in this manner. The capacitance ratio correction voltage VPP may be set at a voltage equal to or higher than the high voltage (e.g. 10 V) supplied as the control drain voltage CD at least during the write LOW operation, for example.

In the above-described configuration, the capacitance C4 of the auxiliary capacitor 33 is set at the same value as the capacitance C3 of the gate capacitor of the detection transistor 41 as an example. However, the invention is not limited thereto. For example, the capacitance C4 of the auxiliary capacitor 33 may be set to be smaller than the capacitance C3 of the gate capacitor of the detection transistor 41.

Figure 6:
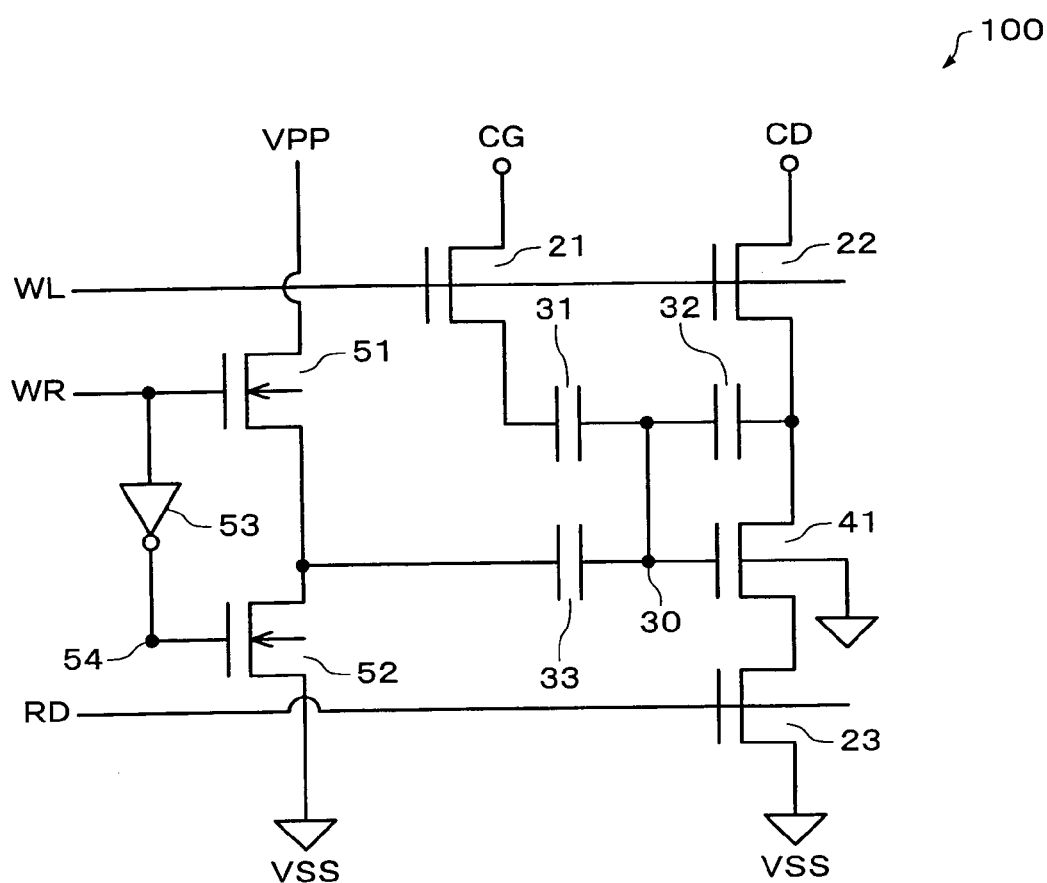
FIG. 6 is another configuration example of the nonvolatile semiconductor memory device according to one embodiment of the invention.

FIG. 6 is a diagram showing a capacitance ratio correction switch 51 which switches the supplying of the capacitance ratio correction voltage VPP in the read operation and the write operation. The EEPROM 100 may be configured to include the capacitance ratio correction switch 51, an N-type transistor 52 (grounding switch or second transistor in a broad sense), and an inverter 53. The EEPROM 100 may have a configuration in which the N-type transistor 52 and the inverter 53 are omitted.

The capacitance ratio correction switch 51 is formed by an N-type transistor (first transistor in a broad sense), for example. The capacitance ratio correction voltage VPP (e.g. 10 V) is supplied to the drain of the capacitance ratio correction switch 51. The other end of the auxiliary capacitor 33 and the drain of the N-type transistor 52 are connected with the source of the capacitance ratio correction switch 51. The source of the N-type transistor 52 is set at a ground level voltage, for example. A write signal line WR is connected with the gate electrode of the capacitance ratio correction switch 51. The write signal line WR is connected with the gate electrode of the N-type transistor 52 through the inverter 53, for example.

A signal set to active (e.g. signal set at high level) is supplied to the write signal line WR during the write operation including the write HIGH operation and the write LOW operation, for example. This causes the capacitance ratio correction switch 51 to be turned ON and the N-type transistor 52 to be turned OFF. Specifically, the capacitance ratio correction voltage VPP is supplied to the other end of the auxiliary capacitor 33. A signal set to inactive (e.g. signal set at low level) is supplied to the read signal line RD so that the read transistor 23 is turned OFF.

A signal set to inactive (e.g. signal set at low level) is supplied to the write signal line WR during the read operation. This causes the capacitance ratio correction switch 51 to be turned OFF, the N-type transistor 52 to be turned ON, and the other end of the auxiliary capacitor 33 to be set at a ground level voltage VSS, for example. A signal set to active (e.g. signal set at high level) is supplied to the read signal line RD so that the read transistor 23 is turned ON. This allows the ON/OFF state of the detection transistor 41 to be read by a sense amplifier or the like.

In the EEPROM 100, the above-described configuration allows the capacitance ratio correction voltage VPP to be supplied to the other end of the auxiliary capacitor 33 during the write operation and prevents the capacitance ratio correction voltage VPP from being supplied to the other end of the auxiliary capacitor 33 during the read operation. Since the other end of the auxiliary capacitor 33 can be set at a ground level voltage or in a floating state during the read operation, the auxiliary capacitor 33 does not act as an obstructive capacitor when detecting the ON/OFF state of the detection transistor 41.

Figure 7:
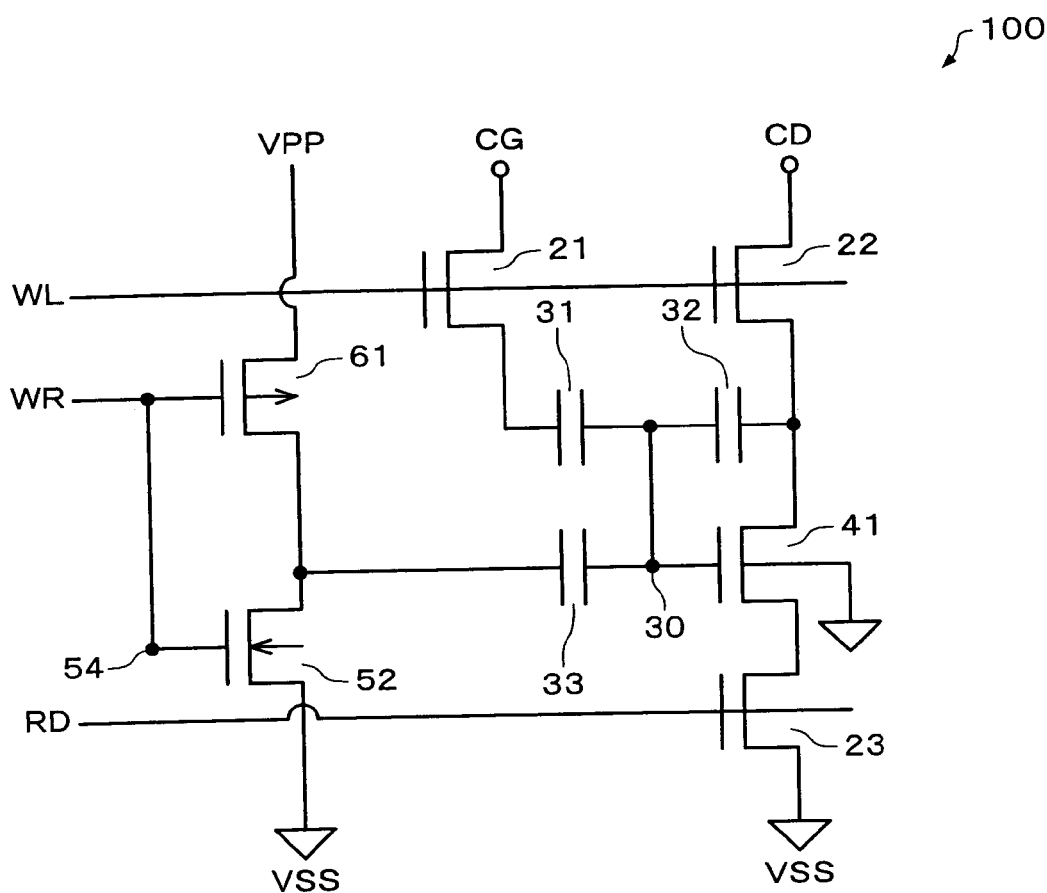
FIG. 7 is a modification of the nonvolatile semiconductor memory device according to one embodiment of the invention.

A capacitance ratio correction switch 61 shown in FIG. 7 may be provided instead of the capacitance ratio correction switch 51. In the EEPROM 100 shown in FIG. 7, the capacitance ratio correction switch 61 formed by a P-type transistor (first transistor in a broad sense) is provided instead of the capacitance ratio correction switch 51 shown in FIG. 6, and the inverter 53 shown in FIG. 6 is omitted. In this case, a low active signal (e.g. signal set at low level) is supplied to the write signal line WR during the write operation. This causes the capacitance ratio correction switch 61 to be turned ON and the N-type transistor 52 to be turned OFF. Specifically, the capacitance ratio correction voltage VPP is supplied to the other end of the auxiliary capacitor 33 during the write operation.

A signal set to inactive (e.g. signal set at high level) is supplied to the write signal line WR during the read operation so that the capacitance ratio correction switch 61 is turned OFF and the N-type transistor 52 is turned ON. This causes the other end of the auxiliary capacitor 33 to be set at the ground level voltage VSS during the read operation, for example. The operation for the read signal line RD is similar to that of the EEPROM 100 shown in FIG. 6 during the write operation and the read operation. The N-type transistor 52 may be omitted, and the other end of the auxiliary capacitor 33 may be set in a floating state during the read operation.

In the EEPROM 100 shown in FIGS. 6 and 7, the read signal line RD may be connected with a node 54.

3. Layout

Figure 8:
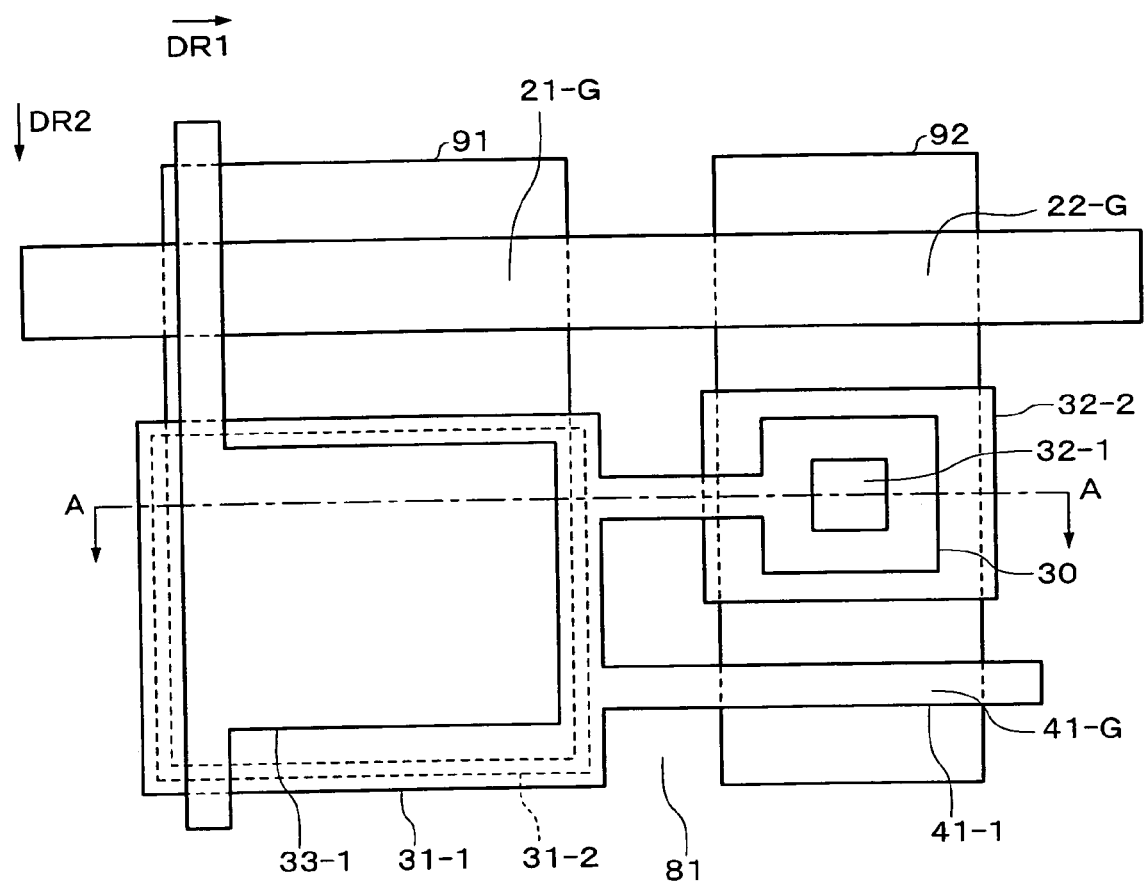
FIG. 8 shows a layout of the nonvolatile semiconductor memory device according to one embodiment of the invention.

FIG. 8 is a diagram showing the layout of the EEPROM 100.

Diffusion regions 91 and 92 are separated by an element isolation region 81. Symbols DR1 and DR2 indicate directions. The direction DR2 is a direction perpendicular to the direction DR1. The element isolation region 81 is formed by local oxidation of silicon (LOCOS) or shallow trench isolation (STI), for example. A region 31-2 indicates a high-concentration impurity implanted region, and indicates a region in which a lower electrode of the first capacitor 31 is formed (first capacitor formation region in a broad sense). A region 32-2 indicates a high-concentration impurity implanted region, and indicates a region in which a lower electrode of the second capacitor 32 is formed (second capacitor formation region in a broad sense).

A region 31-1 indicates a region in which an upper electrode of the first capacitor 31 is formed in a first polysilicon layer (first capacitor formation region in a broad sense), for example. A region 32-1 indicates a region in which an upper electrode of the second capacitor 32 is formed in the first polysilicon layer (second capacitor formation region in a broad sense). A region 33-1 indicates a region in which an upper electrode of the auxiliary capacitor 33 is formed. The upper electrode of the auxiliary capacitor 33 is formed in a first aluminum interconnect layer, for example. The auxiliary capacitor 33 is formed so that the upper electrode of the capacitor 31 indicated by the region 31-1 is used as a lower electrode of the auxiliary capacitor 33 and makes a pair with the upper electrode formed in the first aluminum interconnect layer.

The auxiliary capacitor 33 is formed in the region over the regions 31-1 and 31-2 in which the first capacitor 31 is formed (first capacitor formation region in a broad sense).

As shown in FIG. 8, the regions 32-1 and 32-2 in which the second capacitor 32 is formed (second capacitor formation region in a broad sense) are formed on the side of the regions 31-1 and 31-2 in which the first capacitor 31 is formed in the first direction DR1. The areas of the regions 32-1 and 32-2 in which the second capacitor 32 is formed are smaller than the areas of the regions 31-1 and 31-2 in which the first capacitor 31 is formed.

Gate electrodes 21-G and 22-G of the select transistors 21 and 22 are formed in a second polysilicon layer in the upper layer of the first polysilicon layer, for example. A region in which the gate electrode 21-G of the select transistor 21 is formed (first select transistor gate electrode formation region in a broad sense) is formed on the side of the regions 31-1 and 31-2 in which the first capacitor 31 is formed in the direction opposite to the second direction DR2. A region in which the gate electrode 22-G of the select transistor 22 is formed (second select transistor gate electrode formation region in a broad sense) is formed on the side of the regions 32-1 and 32-2 in which the second capacitor 32 is formed in the direction opposite to the second direction DR2 and on the side of the region in which the gate electrode 22-G of the select transistor 22 is formed in the first direction DR1.

A gate electrode 41-G of the detection transistor 41 is formed in the first polysilicon layer, for example. The gate electrode 41-G is connected with the upper electrode of the capacitor 31 in the region 31-1. A detection transistor gate electrode formation region 41-1 in which the gate electrode 41-G of the detection transistor 41 is formed is formed on the side of the regions 31-1 and 31-2 in which the first capacitor 31 is formed in the first direction DR1 and on the side of the regions 32-1 and 32-2 in which the second capacitor 32 is formed in the second direction DR2.

The upper electrodes of the capacitors 31 and 32 and the gate electrode 41-G formed in the first polysilicon layer also serve as the floating node 30.

In order to apply an electric field of 10 MV/cm or more to the tunnel film of the capacitor 32, it is necessary to set the capacitance C1 of the capacitor 31 to be sufficiently greater than the capacitance C2 of the capacitor 32. Since the oxide film of the capacitor 32 is a thin tunnel film, it is necessary to increase the area of the electrode of the capacitor 31 in order to set the capacitance C1 of the capacitor 31 to be greater than the capacitance C2 of the capacitor 32. The area of the upper electrode of the capacitor 31 indicated by the region 31-1 is set to be larger than the area of the upper electrode of the capacitor 32 indicated by region 32-1 in order to ensure such a capacitance ratio.

Figure 9:
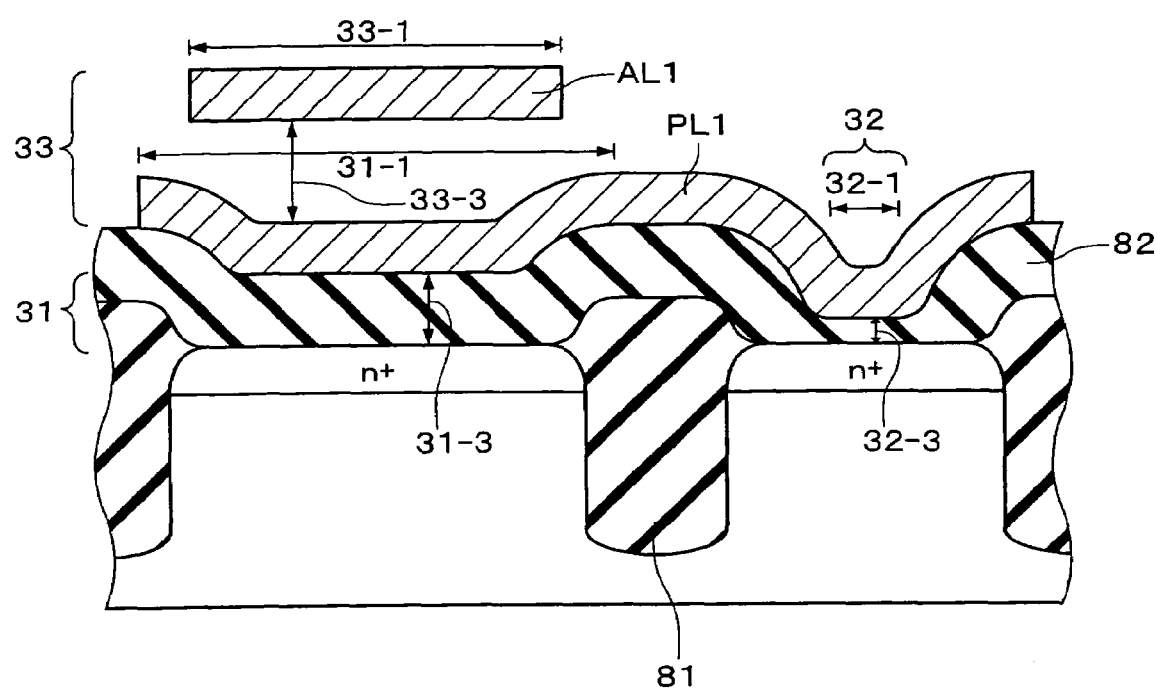
FIG. 9 is a cross-sectional diagram showing the cross section along the line A-A shown in FIG. 8.

FIG. 9 is a cross-sectional diagram showing the cross section along the line A-A shown in FIG. 8. A symbol AL1 indicates the upper electrode of the auxiliary capacitor 33, which is formed in a region 33-1 of the first aluminum interconnect layer, for example. A symbol PL1 indicates an interconnect formed in the first polysilicon layer, which includes the upper electrodes of the capacitors 31 and 32 formed in the first polysilicon layer. As shown in FIG. 9, a thickness 32-3 of an oxide film 82 of the capacitor 32 is smaller than a thickness 31-3 of an oxide film 82 of the capacitor 31 so that a tunnel current flows. The thickness 31-3 is set at 100 to 200 Å, and the thickness 32-3 is set at 70 to 80 Å, for example. However, since the area of the formation region 31-1 of the upper electrode of the capacitor 31 is sufficiently larger than the area of the formation region 32-1 of the upper electrode of the capacitor 32, the above-mentioned capacitance ratio can be achieved.

A thickness 33-3 of the oxide film of the auxiliary capacitor 33 is greater than the thicknesses 31-3 and 32-3. In one embodiment of the invention, the formation region of the auxiliary capacitor 33 is secured by utilizing the formation region of the upper electrode of the capacitor 31. This enables the capacitance C4 of the auxiliary capacitor 33 to be increased while achieving an efficient circuit layout.

4. Comparison with Comparative Example

Figure 10:
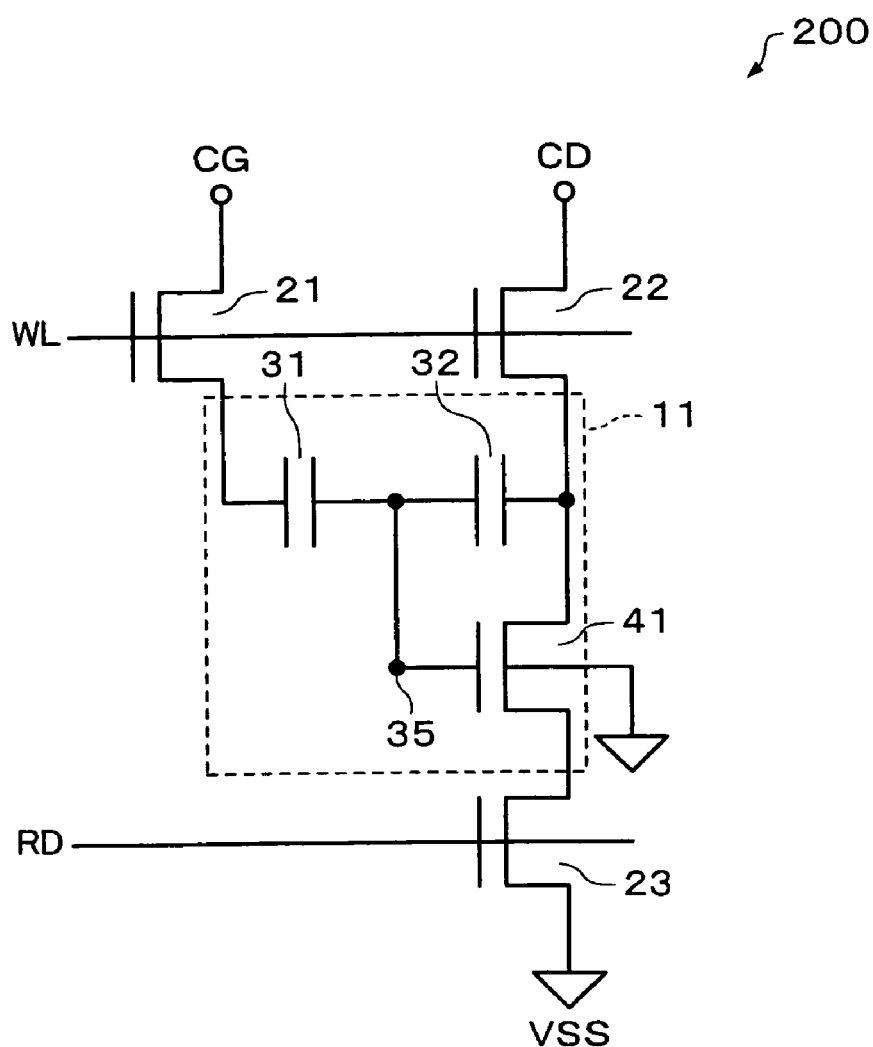
FIG. 10 is a configuration example of a comparative example according to one embodiment of the invention.

FIG. 10 is a diagram showing a part of an EEPROM 200 in a comparative example according to one embodiment of the invention. The EEPROM 200 includes the select transistors 21 and 22, a cell 11, and the read transistor 23. The cell 11 includes the first and second capacitors 31 and 32, a floating node 35, and the detection transistor 41. The auxiliary capacitor 33 is not provided in the EEPROM 200.

In the EEPROM 200 in the comparative example, the control gate voltage CG is set at a high voltage (e.g. 10 V) and the control drain voltage CD is set at a low voltage (e.g. 0 V) during the write HIGH operation. Since the select voltage is supplied to the wordline WL, 10 V is supplied to one end of the first capacitor 31, and 0 V is supplied to the other end of the second capacitor 32, for example. In the write operation, a signal set to inactive is supplied to the read signal line RD so that the read transistor 23 is turned OFF.

In this case, the potential of the floating node 35 is set at a potential based on the capacitance ratio, the control gate voltage CG, and the control drain voltage CD. In this case, the capacitance ratio is determined by the capacitances of the first and second capacitors 31 and 32 and the gate capacitance of the detection transistor 41 with respect to the substrate potential.

Figure 11:
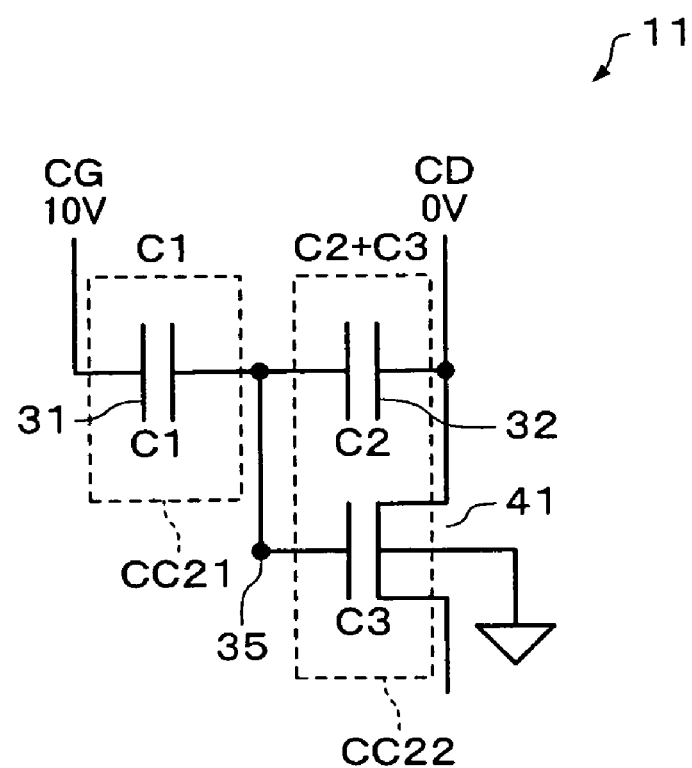
FIG. 11 is illustrative of a write HIGH operation of the comparative example according to one embodiment of the invention.

FIG. 11 is a diagram showing the capacitance ratio of the cell 11 during the write HIGH operation.

The capacitances of the capacitors 31 and 32 are respectively indicated by C1 and C2 and the gate capacitance of the detection transistor 41 with respect to the substrate potential is indicated by C3 in the same manner as in FIG. 3. In this case, the other end of the capacitor 32 is set at 0 V. The gate capacitance C3 of the detection transistor 41 is the capacitance with respect to the substrate potential. Specifically, the capacitor 32 and the gate capacitor of the detection transistor 41 are connected in parallel.

Specifically, a capacitor CC21 having a capacitance of C1 and a composite capacitor CC22 having a capacitance of "C2+C3" are connected in series through the floating node 35. The control gate voltage CG (e.g. 10 V) and the control drain voltage CD (e.g. 0 V) are supplied to opposite ends of the composite capacitors CC21 and CC22 connected in series.

Suppose that the capacitance ratio is "C1:C2:C3:=8:2:1", for example. Therefore, the capacitance ratio of the capacitor CC1 to the composite capacitor CC2 is "8:(2+1)=8:3". In this case, about 7.3 V, which is obtained by capacitively dividing 10 V at a ratio of "3:8", should be applied to the tunnel film of the capacitor 32.

In this case, a tunnel current flows through the tunnel film of the capacitor 32 so that the potential difference is reduced to about 6 V after a short time.

Specifically, a negative electric charge is injected into the floating node 30. The write HIGH operation is performed in this manner.

In the write LOW operation, the control gate voltage CG is set at a low voltage (e.g. 0 V), and the control drain voltage CD is set at a high voltage (e.g. 10 V). Since the select voltage is supplied to the wordline WL, 0 V is supplied to one end of the first capacitor 31, and 10 V is supplied to the other end of the second capacitor 32, for example. A signal set to inactive is supplied to the read signal line RD so that the read transistor 23 is turned OFF in the same manner as in the write HIGH operation.

In this case, the potential of the floating node 35 is set at a potential based on the capacitance ratio, the control gate voltage CG, and the control drain voltage CD in the same manner as in the write HIGH operation.

Figure 12A:
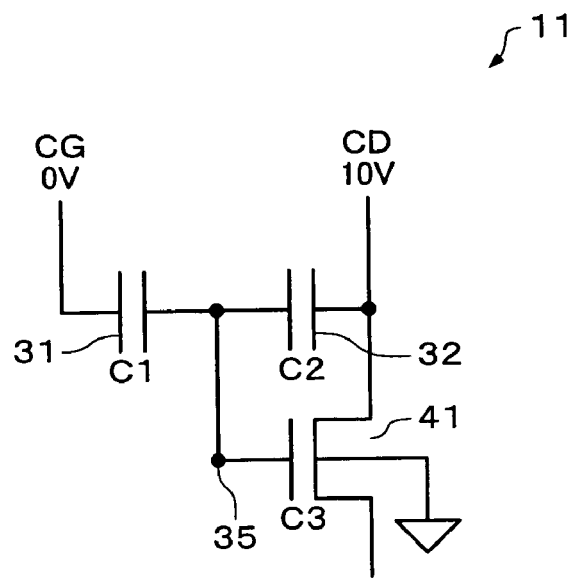
FIGS. 12A and 12B are illustrative of a write LOW operation of the comparative example according to one embodiment of the invention.
Figure 12B:
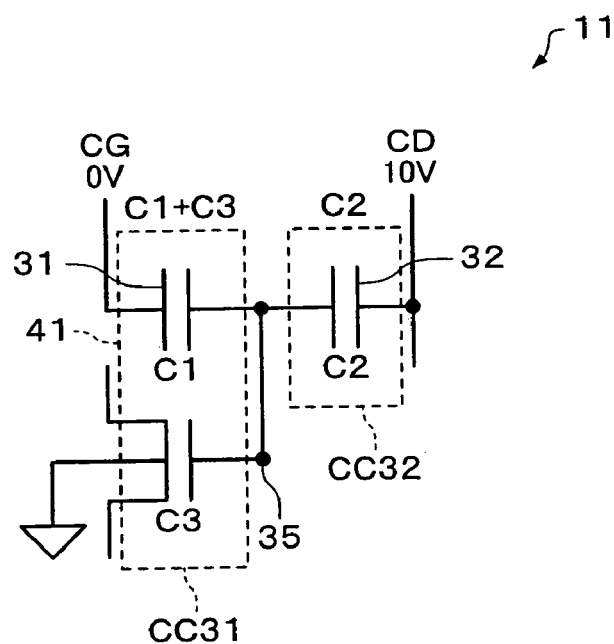

FIGS. 12A and 12B are diagrams showing the capacitance ratio of the cell 11 during the write LOW operation. FIGS. 12A and 12B illustrate the case where the capacitances C1 to C3 are set at a capacitance ratio similar to that of FIG. 11. As shown in FIG. 12A, 0 V is supplied to one end of the capacitor 31, and 10 V is supplied to the other end of the capacitor 32. Specifically, the capacitor 31 and the gate capacitor of the detection transistor 41 are connected in parallel, as shown in FIG. 12B.

Therefore, a composite capacitor CC31 having a capacitance of "C1+C3" and a capacitor CC32 having a capacitance of C2 are connected in series through the floating node 35. The control gate voltage CG (e.g. 0 V) and the control drain voltage CD (e.g. 10 V) are supplied to opposite ends of the composite capacitors CC31 and CC32 connected in series.

Therefore, the capacitance ratio of the composite capacitor CC31 to the capacitor CC32 is "(8+1):2=9:2". In this case, about 8.2 V, which is obtained by capacitively dividing 10 V at a ratio of "2:9", should be applied to the tunnel film of the capacitor 32. However, since a tunnel current flows through the tunnel film of the capacitor 32 during the write LOW operation in the same manner as in the write HIGH operation, the potential difference is reduced to about 6 V after a short time.

Specifically, a negative electric charge is discharged from the floating node 35.

As described above, the voltage applied to the tunnel film of the capacitor 32 differs between the write HIGH operation and the write LOW operation. In more detail, about 7.3 V is applied to the tunnel film of the capacitor 32 during the write HIGH operation, and about 8.2 V is applied to the tunnel film of the capacitor 32 during the write LOW operation. This means that the amount of electric charge injected during the write HIGH operation differs from the amount of electric charge discharged during the write LOW operation. Since the capacitance ratio of the capacitors 31 and 32 is "C1:C2=8:2", 7.5V is ideally applied to the tunnel film of the capacitor 32. However, since the gate capacitor of the detection transistor 41 exists, the difference in the voltage applied to the tunnel film occurs between the write HIGH operation and the write LOW operation.

In the comparative example, since about 7.3 V, which is lower than the ideal voltage (7.5 V), is applied to the tunnel film of the capacitor 32 during the write HIGH operation, the number of electrons injected into the floating node 35 is smaller than the case where the ideal voltage (7.5 V) is applied. Specifically, the potential of the floating node 35 becomes higher than that obtained by the ideal write HIGH operation. When the ideal write HIGH operation has been performed, since the potential of the floating node 35 becomes sufficiently lower than the threshold value of the detection transistor 41, the detection transistor is turned OFF. However, since electrons are not sufficiently injected into the floating node 35 by the write HIGH operation of the comparative example, the OFF state of the detection transistor 41 becomes unstable. In a certain case, the detection transistor is turned ON. This means that the write HIGH operation cannot be sufficiently performed.

In the comparative example, since about 8.2 V, which is higher than the ideal voltage (7.5 V), is applied to the tunnel film of the capacitor 32 during the write LOW operation, the number of electrons discharged from the floating node 35 is greater than the case where the ideal voltage (7.5 V) is applied. Specifically, the potential of the floating node 35 becomes lower than that obtained by the ideal write LOW operation. When the ideal write LOW operation has been performed, since the potential of the floating node 35 becomes sufficiently higher than the threshold value of the detection transistor 41, the detection transistor is turned ON. However, since an excess number of electrons is discharged from the floating node 35 by the write LOW operation of the comparative example, overwriting occurs. This causes damage to the tunnel film of the capacitor 32 so that the tunnel film rapidly deteriorates.

As described above, the EEPROM 200 in the comparative example has a problem in which the number of electrons injected into or discharged from the floating gate 35 differs between the write HIGH operation and the write LOW operation, whereby the endurance is decreased.

On the other hand, one embodiment of the invention can solve the above-described problem by the function of the auxiliary capacitor 33. As shown in FIGS. 3, 5A and 5B, in the EEPROM 100 according to one embodiment of the invention, the capacitance ratio during the write HIGH operation is "CC1:CC2=9:3", and the capacitance ratio during the write LOW operation is "CC11:CC12=9:3". Specifically, the capacitance ratio is identical during the write HIGH operation and the write LOW operation. Therefore, according to one embodiment of the invention, since the same voltage is applied to the tunnel film of the capacitor 32 during the write HIGH operation and the write LOW operation, a well-balanced write operation can be performed so that reliability can be maintained.

In the comparative example, the voltage applied to the tunnel film of the capacitor 32 during the write LOW operation is higher than the voltage applied to the tunnel film of the capacitor 32 during the write HIGH operation. Specifically, in the comparative example, the speed of the write HIGH operation is decreased, and the speed of the write LOW operation is increased. When the time necessary for the write HIGH operation and the time necessary for the write LOW operation are poorly balanced, the program time must be set based on the lower speed operation. If the balance is decreased to a large extent, a period of time in which a high voltage is unnecessarily applied is increased during the write LOW operation, so that the lifetime of the element (e.g. tunnel film of the capacitor 32) is decreased.

According to one embodiment of the invention, since the time necessary for the write HIGH operation and the time necessary for the write LOW operation can be balanced, damage to the tunnel film of the capacitor 32 can be reduced. Specifically, the EEPROM 100 according to one embodiment of the invention can stabilize the write HIGH operation and the write LOW operation, so that reliability can be increased.

In the comparative example, when reducing the cell area in order to reduce the cost, the parasitic capacitor (e.g. the gate capacitor of the detection transistor 41) is increased, so that the balance between the write HIGH operation time and the write LOW operation time is decreased. This gives rise to a number of problems such as an unstable operation and a decrease in element lifetime.

According to one embodiment of the invention, since the effects of the parasitic capacitor can be corrected by the auxiliary capacitor 33, the cell area can be reduced while preventing a decrease in the balance between the write HIGH operation time and the write LOW operation time. Specifically, a reduction in cost due to a reduction in the cell area can be easily achieved in comparison with the comparative example.

According to one embodiment of the invention, since the auxiliary capacitor 33 can be formed in the region over the formation region of the capacitor 31, the cell area can be efficiently utilized. For example, the cell according to one embodiment of the invention can be formed using a cell area equal to or smaller than the cell area of the comparative example.

FIG. 11 illustrates the gate capacitor of the detection transistor 41 as the parasitic capacitor, for example. However, the parasitic capacitor is not limited thereto. The parasitic capacitor used herein means a capacitor with respect to the substrate potential and parasitic to the floating gate, for example. The parasitic capacitor causes the capacitance ratio of the cell to differ between the write HIGH operation and the write LOW operation.

According to one embodiment of the invention, a change in the capacitance ratio due to the parasitic capacitor can be corrected by the auxiliary capacitor 33. For example, a change in the capacitance ratio can be corrected by setting the capacitance of the auxiliary capacitor 33 taking into consideration the parasitic capacitor and the gate capacitor of the detection transistor 41.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. For example, any term cited with a different term having broader or the same meaning at least once in this specification or drawings can be replaced by the different term in any place in this specification and drawings.

What is claimed is:

1. A nonvolatile semiconductor memory device comprising:
   a first capacitor, one end of the first capacitor being connected to a floating node;
   a detection transistor, a gate electrode of the detection transistor being connected to the floating node;
   a second capacitor, one end of the second capacitor being connected to the floating node, and the other end of the second capacitor being connected to a drain of the detection transistor; and
   an auxiliary capacitor, one end of the auxiliary capacitor being connected to the floating node,
   wherein, at least during write operation, a control gate voltage is supplied to the other end of the first capacitor, a control drain voltage is supplied to the other end of the second capacitor, and a capacitance ratio correction voltage which is higher than a voltage of the floating node is supplied to the other end of the auxiliary capacitor.

2. The nonvolatile semiconductor memory device as defined in claim 1,
   wherein, at least during write operation, the capacitance ratio correction voltage is set at a voltage equal to or higher than either a voltage supplied to the other end of the first capacitor or a voltage supplied to the other end of the second capacitor, whichever is the higher.

3. The nonvolatile semiconductor memory device as defined in claim 1,
   wherein, at least during write operation, the capacitance ratio correction voltage is set at a voltage equal to either the control gate voltage or the control drain voltage, whichever is the higher.

4. The nonvolatile semiconductor memory device as defined in claim 1, further comprising:
   a capacitance ratio correction switch which is set to ON state during write operation,
   wherein the capacitance ratio correction voltage is supplied to the other end of the auxiliary capacitor through the capacitance ratio correction switch during write operation.

5. The nonvolatile semiconductor memory device as defined in claim 4,
   wherein the capacitance ratio correction switch is formed of a first transistor;
   wherein a drain of the first transistor is connected to the other end of the auxiliary capacitor, and the capacitance ratio correction voltage is supplied to a source of the first transistor; and
   wherein a voltage which sets the first transistor to ON state is supplied to a gate electrode of the first transistor during write operation.

6. The nonvolatile semiconductor memory device as defined in claim 1, wherein a capacitance of the auxiliary capacitor is set to be equal to a gate capacitance of the detection transistor.

7. The nonvolatile semiconductor memory device as defined in claim 1,
wherein the other end of the auxiliary capacitor is set to a floating state during read operation.

8. The nonvolatile semiconductor memory device as defined in claim 1,
wherein the other end of the auxiliary capacitor is set to a ground level voltage during read operation.

9. The nonvolatile semiconductor memory device as defined in claim 4, further comprising:
a grounding switch which is set to OFF state during write operation and is set to ON state during read operation,
wherein a ground level voltage is supplied to the other end of the auxiliary capacitor through the grounding switch during read operation.

10. The nonvolatile semiconductor memory device as defined in claim 5, further comprising:
a second transistor which is set to OFF state during write operation and is set to ON state during read operation,
wherein, during write operation, a write enable signal set to active is supplied to the gate electrode of the first transistor so that the first transistor is set to ON state, a signal obtained by inverting the write enable signal set to active is supplied to a gate electrode of the second transistor so that the second transistor is set to OFF state, and the capacitance ratio correction voltage is supplied to the other end of the auxiliary capacitor through the first transistor which has been set to ON state; and
wherein, during read operation, the write enable signal set to inactive is supplied to the gate electrode of the first transistor so that the first transistor is set to OFF state, a signal obtained by inverting the write enable signal set to inactive is supplied to the gate electrode of the second transistor so that the second transistor is set to ON state, and a ground level voltage is supplied to the other end of the auxiliary capacitor through the second transistor which has been set to ON state.

11. The nonvolatile semiconductor memory device as defined in claim 1, further comprising:
a first select transistor provided between a supply node of the control gate voltage and the other end of the first capacitor; and
a second select transistor provided between a supply node of the control drain voltage and the other end of the second capacitor,
wherein, during write operation, a select voltage is supplied to gate electrodes of the first and second select transistors so that the first and second select transistors are set to ON state, the control gate voltage is supplied to the other end of the first capacitor through the first select transistor which has been set to ON state, and the control drain voltage is supplied to the other end of the second capacitor through the second select transistor which has been set to ON state.

12. The nonvolatile semiconductor memory device as defined in claim 1,
wherein the auxiliary capacitor is formed in a region over a first capacitor formation region in which the first capacitor is formed.

13. The nonvolatile semiconductor memory device as defined in claim 12,
wherein a second capacitor formation region in which the second capacitor is formed is formed on a first direction side of the first capacitor formation region; and
wherein an area of the second capacitor formation region is smaller than an area of the first capacitor formation region.

14. The nonvolatile semiconductor memory device as defined in claim 13,
wherein, when a direction perpendicular to the first direction is a second direction, a detection transistor gate electrode formation region in which the gate electrode of the detection transistor is formed is formed on the first direction side of the first capacitor formation region and on the second direction side of the second capacitor formation region.

15. The nonvolatile semiconductor memory device as defined in claim 14,
wherein a first select transistor gate electrode formation region in which a gate electrode of a first select transistor is formed is formed on a side of the first capacitor formation region in a direction opposite to the second direction; and
wherein a second select transistor gate electrode formation region in which a gate electrode of a second select transistor is formed is formed on a side of the second capacitor formation region in a direction opposite to the second direction and on the first direction side of the first select transistor gate electrode formation region.

* * * * *